(12) United States Patent
Rayfield et al.

(10) Patent No.: US 7,531,431 B2
(45) Date of Patent: May 12, 2009

(54) METHODS FOR REDUCING CONTAMINATION OF SEMICONDUCTOR DEVICES AND MATERIALS DURING WAFER PROCESSING

(75) Inventors: Barry Rayfield, Wake Forest, NC (US); Chris Fanelli, Raleigh, NC (US); Mitch Jackson, Raleigh, NC (US)

(73) Assignee: Cree, Inc., Durham, NC (US)

( * ) Notice: Subject to any disclaimer, the term of this patent is extended or adjusted under 35 U.S.C. 154(b) by 284 days.

(21) Appl. No.: 11/437,934

(22) Filed: May 19, 2006

(65) Prior Publication Data
US 2007/0269980 A1  Nov. 22, 2007

(51) Int. Cl.
*H01L 21/00* (2006.01)
(52) U.S. Cl. .............. 438/460; 438/464; 438/465; 438/770; 257/E21.599; 257/E21.602
(58) Field of Classification Search ............. 438/464, 438/465, 113, 114, 115, 118, FOR. 386, 460, 438/770; 257/E21.599, E21.602
See application file for complete search history.

(56) References Cited

U.S. PATENT DOCUMENTS

| 5,630,883 A * | 5/1997 | Steer et al. .............. 134/22.13 |
| 5,669,979 A * | 9/1997 | Elliott et al. .................... 134/1 |
| 5,962,384 A * | 10/1999 | Cooper et al. ............... 510/175 |
| 2005/0194603 A1 | 9/2005 | Slater, Jr. et al. |
| 2005/0245078 A1 * | 11/2005 | Ohnuma et al. ............. 438/672 |
| 2005/0250308 A1 * | 11/2005 | Yamaguchi et al. ......... 438/618 |
| 2006/0079040 A1 * | 4/2006 | Tanaka et al. ............... 438/166 |
| 2006/0205129 A1 * | 9/2006 | Sato et al. ................... 438/197 |

FOREIGN PATENT DOCUMENTS

JP        08017788 A   *  1/1996
JP    2001308037 A   *  11/2001

* cited by examiner

*Primary Examiner*—Michelle Estrada
*Assistant Examiner*—Jarrett J Stark
(74) *Attorney, Agent, or Firm*—Myers Bigel Sibley & Sajovec

(57) ABSTRACT

Methods of processing a semiconductor structure including a metal layer in the presence of organic material include flowing an aqueous mixture including an oxidizing agent over the semiconductor structure during processing of the semiconductor structure. Processing the semiconductor structure may include sawing the semiconductor structure and/or scrubbing the semiconductor structure with pressurized water. The oxidizing agent may include a peroxide, such as hydrogen peroxide, or another oxidizing agent.

41 Claims, 10 Drawing Sheets

METHODS FOR REDUCING CONTAMINATION OF SEMICONDUCTOR DEVICES AND MATERIALS DURING WAFER PROCESSING

FIELD OF THE INVENTION

The present invention relates to fabrication of semiconductor devices, and in particular to processing of semiconductor wafers that include metal layers thereon.

BACKGROUND

Semiconductor devices are typically fabricated on a substrate that provides mechanical support for the device and often contributes to the electrical performance of the device as well. Silicon, germanium, gallium arsenide, sapphire and silicon carbide are some of the materials commonly used as substrates for semiconductor devices. Many other materials, including semiconductor as well as non-semiconductor materials, may also be used as substrates for semiconductor devices. Semiconductor device manufacturing typically involves fabrication of many semiconductor devices on a single substrate.

Substrates are typically formed in the shape of circular wafers having a diameter presently ranging, for example, from less than 1 inch (2.54 cm) to over 12 inches (30.5 cm) depending on the type of material involved. Other shapes such as, for example, square, rectangular or triangular wafers are possible, however. In addition, broken and/or irregular wafers may still be used to fabricate semiconductor devices. Semiconductor devices are formed on the wafers by the precise formation of thin layers of semiconductor, insulator and metal materials that are deposited and patterned to form useful semiconductor devices such as diodes, transistors, solar cells and other devices.

Individual semiconductor devices may be relatively small compared to the size of the wafer on which they are formed. For example, a typical light emitting diode (LED) chip such as the C430-XB290 LED chip manufactured by Cree, Inc., in Durham, N.C. measures only about 290 microns by 290 microns square (1 micron=0.0001 cm). Accordingly, a very large number of LED chips (also referred to as "dice") may be formed on a single 2 inch (5.08 cm) diameter silicon carbide (SiC) wafer. After the dice are formed on the wafer, at least some of the individual dice are generally separated so that they can be mounted and encapsulated to form individual devices. The process of separating the individual dice is sometimes referred to as "dicing" the wafer or "singulating" the dice.

Dicing a wafer into individual semiconductor devices may be accomplished by a number of methods. One method of dicing a wafer involves mounting the wafer on an adhesive surface and sawing the wafer with a circular saw. A series of closely spaced saw cuts is made first in one direction and then in a second direction perpendicular or oblique to the first direction. Thereby, a number of individually diced, square, rectangular, or other regularly shaped devices are produced. Other methods of dicing, such as "scribe-and-break" are possible. However, sawing may be preferable for certain applications and substrate types. In particular, for the fabrication of LEDs on silicon carbide substrates, sawing or partially sawing the substrate may be preferable.

Sawing is typically performed using an abrasive circular saw blade under a flow of purified water. The water may assist with the removal of both heat and unwanted byproducts of the sawing process, such as silicon carbide dust.

It is generally desirable to avoid or reduce contamination of the semiconductor wafer. As is well known in the semiconductor art, contamination of a semiconductor wafer may have a number of detrimental effects on semiconductor devices formed from the wafer. For example, contamination may reduce device performance or even render a device non-functional. In the case of LEDs, contamination may cause a device to have a lower light output and/or a higher operating voltage. Contamination may also harm the metal contacts on an LED device, potentially making it more difficult to package the device reliably and/or reducing light output from the device.

During the sawing operation, contaminants may be introduced to the semiconductor wafer from a number of sources such as, for example, the mounting tape, the saw, the water, and even from the substrate itself in the form of sawdust. Contamination is typically addressed by increasing the purity of the materials used in the sawing process, for example, by using higher purity water and/or tape that contains fewer contaminants, and/or by cleaning the wafers prior to sawing. Protective layers have also been used to reduce contamination. However, even when using such measures, it may be difficult to reduce contamination to a desirable level in conventional sawing systems. Accordingly, it may be desirable to reduce contamination to the substrate and associated semiconductor devices that may result from a sawing operation.

SUMMARY

Some embodiments of the invention provide methods of operating a dicing saw including a rotary saw blade and configured to saw a semiconductor substrate. The methods include flowing a mixture of water and an oxidizing agent over the semiconductor substrate, and sawing the semiconductor substrate with the dicing saw. Sawing the semiconductor substrate may be performed while flowing the mixture over the semiconductor substrate. Flowing the mixture over the semiconductor substrate may include flowing the mixture over the semiconductor substrate at a location where the saw blade contacts the semiconductor substrate.

The dicing saw may be configured to saw through the semiconductor substrate and/or to saw into, but not through, the semiconductor substrate.

The substrate may include a conductive material. In particular, the substrate may include silicon carbide, silicon, gallium arsenide, germanium, aluminum and/or copper. The substrate may include a metal layer thereon including a metal that may be susceptible to ionization by an ionizing agent. The metal layer may include gold, palladium and/or platinum.

The oxidizing agent may include a peroxide such as hydrogen peroxide at a concentration of about 20 to about 250 ppm by volume. In particular embodiments, the mixture may include approximately 100 ppm by volume of hydrogen peroxide. In other embodiments, the oxidizing agent may include sodium peroxide, calcium peroxide, magnesium peroxide, and/or urea hydrogen peroxide.

The oxidizing agent may include potassium monopersulfate, ammonium permanganate, a chlorate, ammonium iodate and/or other iodates having a concentration of about 20 to about 400 ppm by volume.

In some embodiments, the oxidizing agent may be included in the mixture at a concentration that produces a concentration of $O^-$ ions of between about 20 and about 250 ppm by volume.

The oxidizing agent may include ozonated water having a concentration of at least about 1 ppm by volume.

The mixture may further include a catalyst or oxidation enhancer, such as tetraacetylethylenediamine (TAED).

The methods may further include exposing the mixture to light having a wavelength of between about 254 nm and about 360 nm. Exposing the mixture to light may be performed after the mixture has been flowed over the substrate.

According to some embodiments of the invention, methods of processing a semiconductor structure including a metal layer in the presence of organic material include flowing an aqueous mixture including an oxidizing agent over the semiconductor structure during processing of the semiconductor structure. Processing the semiconductor structure may include sawing the semiconductor structure and/or scrubbing the semiconductor structure with pressurized water.

Methods of forming a semiconductor device according to some embodiments of the invention include forming a semiconductor device precursor structure on a substrate, and separating the semiconductor device precursor structure from the substrate while flowing a mixture of water and an oxidizing agent over the substrate. Separating the semiconductor device precursor structure may include sawing the substrate. The semiconductor device precursor may include a light emitting device precursor.

The methods may further include mounting the substrate on a mounting film, which may include a flexible adhesive tape. The substrate may include silicon carbide, silicon, gallium arsenide, germanium, aluminum and/or copper.

The semiconductor device precursor structure may include a metal layer, which may include gold, platinum and/or palladium.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
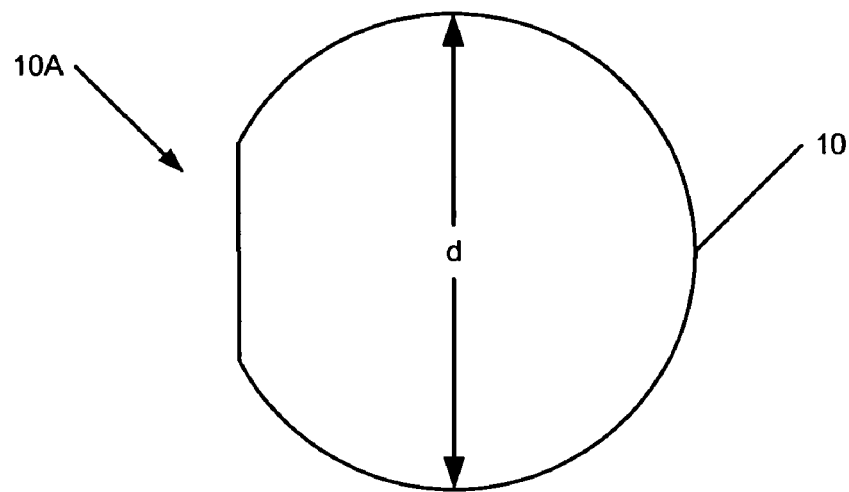
FIGS. 1A-1B are diagrams illustrating a wafer and conventional sawing techniques.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A illustrates a typical semiconductor substrate formed in the shape of a generally circular wafer 10. The wafer 10 includes a primary flat 10A for orientation. For silicon carbide wafers sold by Cree, Inc., the primary flat is oriented such that the chord is formed parallel to the <1120> crystallographic direction. A smaller secondary flat (not shown) may also be formed along an edge of the wafer perpendicular or oblique to the primary flat. The primary and secondary flats may be used to orient the wafer during various processing operations, such as device fabrication and separation.

Figure 1B:
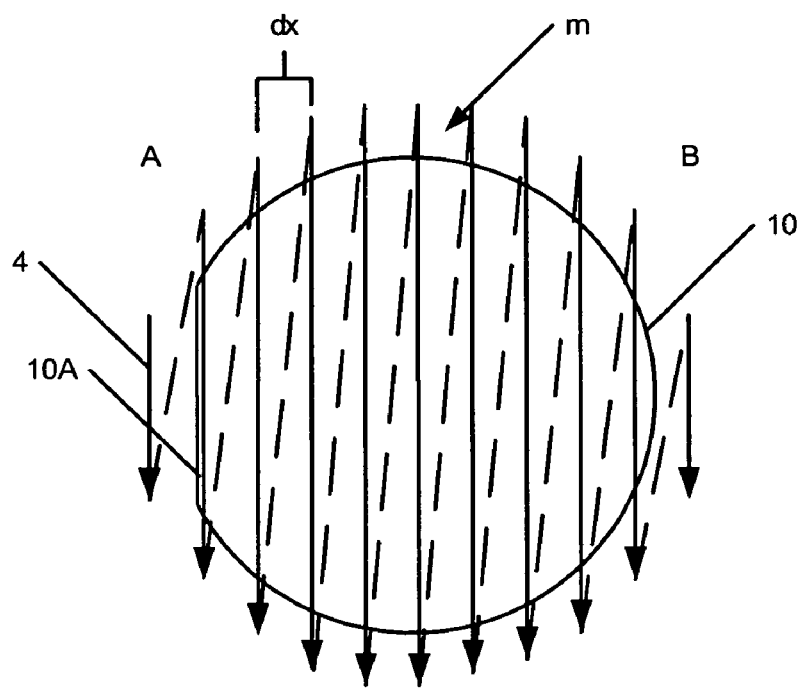

FIG. 1B illustrates the general movement of a saw blade across the wafer 10 during a sawing operation. As explained above, at last some of the individual semiconductor devices ("dice") formed on a wafer must be separated prior to packaging. One way of separating the dice is by sawing the wafer into square or rectangular pieces. Other shapes, such as triangles, also may be provided. Prior to sawing, the wafer 10 may be mounted on an adhesive tape attached to a film frame in a wafer carrier (not shown) that holds the wafer 10 and the separated die in place while being sawed.

Sawing may be accomplished by moving a rotating saw blade across the wafer as illustrated in FIG. 1B. Beginning at point "A" shown on FIG. 1B, the saw blade is moved in the direction illustrated by solid line 4 over a distance based on a circular path established by the diameter "d" of the wafer 10 plus an additional distance "m" that acts as a safety margin to ensure that the saw is a sufficient distance from the wafer before it is recovered and to compensate for any deviation in placement of the wafer 10.

Once the saw blade has traveled the entire distance indicated by solid line 4, the blade is lifted away from the wafer and moved back to its next starting position, as illustrated by the dashed lines. The next starting position may be based upon the assumed d+2m cutting diameter and where the previous cut occurred within a circle of diameter d+2m. The wafer 10 is also moved laterally a precise distance dx so that the saw blade is properly positioned to make the next cut along the next solid line. In effect, the saw blade is recovered along a path indicated by dashed lines to the beginning of the next saw cut, which is located a distance "dx" away from the previous cut. The process is repeated along the entire width of the wafer until a series of parallel cuts has been formed in the wafer 10. The wafer 10 may then be rotated, for example by 90°, and the saw cuts may be repeated to define individual dice.

Figure 2:
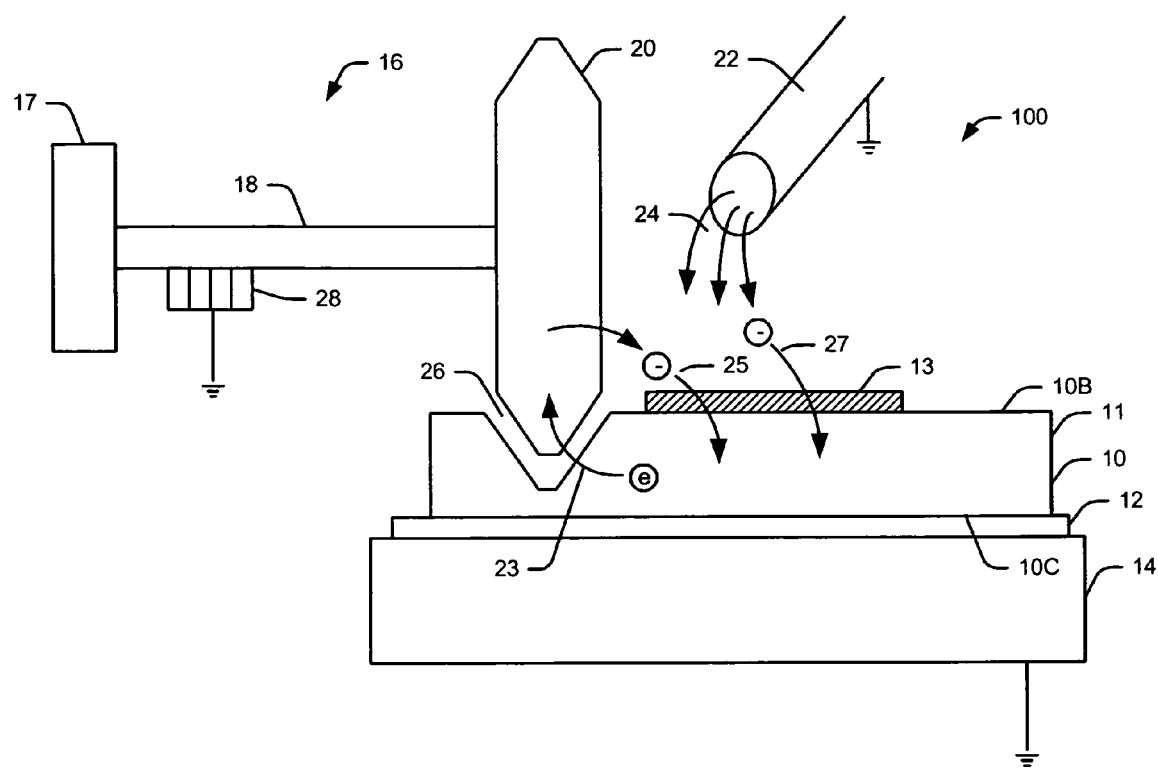
FIG. 2 is a diagram illustrating a conventional system for sawing a wafer.

FIG. 2 illustrates a conventional system 100 and associated methods for sawing a semiconductor wafer 10. As illustrated therein, a semiconductor wafer 10 is mounted on an optional adhesive tape 12 and placed on a chuck 14. The chuck 14 may be grounded as indicated in FIG. 2.

In some embodiments, the wafer 10 may be an epitaxial wafer having an epitaxial layer (not shown) formed on a substrate 11. Thus, in some embodiments, the wafer 10 may include a substrate side (or back side) 10B and an epitaxial side (or front side) 10C. In the system 100 illustrated in FIG. 2, a saw cut 26 is made on the substrate, or back side 10B of the wafer 10. In some embodiments, the substrate 11 may include a semiconductor material such as silicon, silicon carbide, gallium arsenide, germanium, etc., or a non-semiconductor material such as a metal (e.g. aluminum or copper) or ceramic. In particular embodiments, the wafer 10 includes an n-type silicon carbide substrate 11 having the 4H or 6H polytype and an epitaxial region including layers of Group III-nitride semiconductor materials formed on the substrate 11. It will be appreciated that, in some embodiments according to the invention, the saw cut 26 could be made on the epitaxial side 10C of the wafer 10.

In addition, one or more metal layers such as the metal 13 layer may be formed on the back side 10B and/or the front side 10C of the wafer 10 prior to sawing. The metal layers may include an ohmic or rectifying contact on the substrate 11 and/or an epitaxial region thereon. The metal layers may include a metal stack including, for example, an ohmic, a reflective layer, a bonding layer or bond pad and/or one or more barrier layers to protect metal and/or semiconductor layers from contamination. Examples of various metal stacks for light emitting devices are disclosed in commonly assigned U.S. Patent Publication No. 2005/0194603 dated Sep. 8, 2005, the disclosure of which is incorporated herein by reference as if fully set forth herein.

In particular, the metal layer 13 may include at least one layer including a metal such as gold, palladium and/or platinum that is susceptible to being ionized by an ionizing agent. As used herein, the term "ionizing agent" refers to a material that may cause ionization of a surface of a metal. For example, in some embodiments, the substrate 11 may include a light emitting device precursor structure including at least a bonding layer that comprises gold, platinum and/or palladium, either as an individual layer and/or in an alloy. Such metals may be susceptible to ionization by an ionizing agent such as phosphorus, which is a common contaminant that may be introduced during various semiconductor processing operations. When an ionizing agent comes in contact with a metal layer 13 including gold, platinum and/or palladium, it may cause a surface of the metal layer 13 to become ionized. For example, atomic phosphorus may react with an exposed surface of the metal layer 13 to form a reactive monolayer on the metal layer 13. Ionization of the metal layer 13 may occur even at room temperature.

Phosphorus may be introduced in many kinds of semiconductor processing operations, such as during reactive ion etching (RIE) and similar processes. Phosphorus may also be present in photoresist films, which are commonly used in semiconductor processing.

The ionized metal layer 13 may attract other particles that may be present during semiconductor processing. For example, an ionized metal layer 13 may attract organic compounds such as phthalates and/or phenols that may be present. In particular, materials such as the adhesive tape 12 may include phthalates, which are organic chemical compounds typically used as plasticizers. Phthalates and other polar reactive or non-reactive organic oligomers or monomers washed from the adhesive tape may come into contact with the ionized metal layer 13, where they may react to form a stabilized layer, or physically agglomerate, on the metal layer 13. The reactive organic species, which can include acrylates and other organic oligomers, may then continue to build-upon the metal layer 13 through a polymerization process to form a film on the metal layer 13. Such a film may be particularly undesirable for optoelectronic semiconductor devices. For example the film may be thick enough to block light that may otherwise pass through the metal layer 13. Thus, for a light emitting diode device, the presence of a polymer film on the metal layer 13 may undesirably block some light from escaping the device, thereby potentially reducing light emission characteristics of the device.

Organic materials may be introduced to a semiconductor wafer from other sources during semiconductor processing operations. For example, organic materials may be present in adhesives, equipment (e.g. rubber gaskets, stops, etc.) and/or substances (e.g. UV inhibitors) used in semiconductor processing operations.

Continuing with the description of FIG. 2, The wafer 10 may be sawed using a saw 16 that includes a rotating spindle 18 driven by a motor 17. A rotating saw blade 20 is mounted on the spindle 18, which may be electrically isolated from the motor 17. As the saw blade 20 is rotated at high speed by the spindle 18 and brought into contact with the wafer 10, the saw blade 20 makes a saw cut 26 in the wafer 10. As discussed above, the saw cut 26 may extend partially through the wafer 10 as illustrated in FIG. 2, or it may extend completely through the wafer 10.

As further illustrated in FIG. 2, a brush 28 may be in electrical contact with the spindle 18. The brush 28 may be used as part of a touch-off blade height calibration process that is performed before the sawing process begins. During the sawing process, the brush 28 may be grounded.

The water 24, which may include reverse osmosis (RO) purified water, is flowed over the wafer 10 from water source pipe 22 to remove heat and unwanted byproducts of the sawing process. The water source pipe 22 may be grounded as illustrated schematically in FIG. 2.

Electrochemical effects that may typically occur during the sawing process may exacerbate the problem of contamination. For example, during the sawing process, current may flow from the substrate 11 to the saw blade 20 as indicated by arrow 23. The saw blade 20 may form a Schottky contact with the substrate 11, and there may also be a parasitic resistance between the saw blade 20 and the substrate 11.

Due to the transfer of electrons from the substrate 11 to the saw blade 20, there may be a build-up of fixed positive charges in the substrate 11 during the sawing operation, which may contribute to the ionization of the metal layer 13. While the saw blade 20 may be isolated from the drive motor 17, the saw blade 20 and the spindle 18 may be grounded by the spindle brushes 28, which are used for touch-off blade height calibration. Thus, there may be no corresponding build-up of negative charges in the saw blade 20 that may otherwise inhibit the transfer of electrons from the substrate 11 to the saw blade 20.

The positively charged substrate 11 tends to attract negative charges. As the wafer is mounted on an insulating surface (namely, the adhesive tape 12), the most likely source of negative charges available to the substrate 11 may come from contaminants in the water 24. While the water 24 may have a high resistivity, electrically charged contaminants in the water 24 may be attracted to the substrate 11 and may deposit on the substrate 11 including the ohmic contacts (not shown) formed thereon.

Thus, during the sawing operation, a current path 25 may exist from the saw blade 20 through the water 24 to the substrate 11 that may carry contaminants to the wafer 10 and cause the contaminants to preferentially deposit on the wafer 10 by means of an electrolysis process and/or electrostatic attraction of particles. An alternative current path 27 may form from ground through the water source pipe 22 and the water 24 to the substrate 11. Either current path 25, 27 may result in electrolytic contamination of the wafer 10.

In order to prevent contaminants flowing in the water 24 from depositing on the wafer 10 and/or to reduce the deposition of such contaminants on the wafer 10, some systems and methods have been developed for biasing the wafer 10, biasing the saw blade 20, and/or grounding the wafer 10. In particular, by providing an alternative current path from ground to the substrate 11, current flow through the "harmful" current paths 25, 27 running through the water 24 may be reduced, thereby reducing unwanted deposition of contaminants on the wafer 10.

Figure 3:
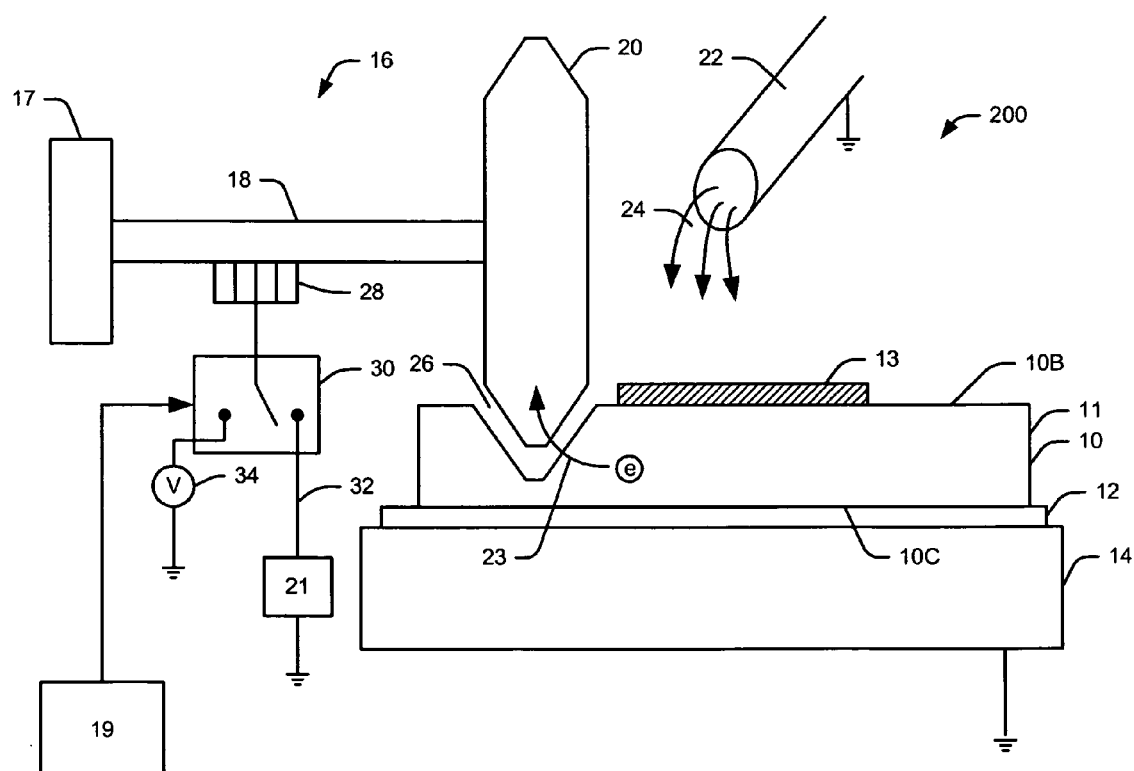
FIG. 3 is a diagram illustrating a system for biasing a saw blade during wafer sawing.

For example, as illustrated in the system 200 of FIG. 3, some embodiments of the invention provide a switch 30 for selectively biasing the saw blade 20 through the spindle 18. The switch 30 may include, for example, a relay circuit. System 200 shown in FIG. 3 includes a number of items in common with the system 100 of FIG. 2. In particular, the system 200 of FIG. 3 includes a saw 16 including a rotating saw blade 20 mounted to a drive spindle 18 that is driven by a motor 20. The saw blade 20 forms a saw cut 26 in a wafer 10 mounted on an adhesive tape 12.

As illustrated in FIG. 3, the switch 30 is coupled to the existing calibration brushes 28, which in conventional systems may be grounded during the sawing operation. In the embodiments illustrated in FIG. 3, the switch 30 controllably switches the brushes from a calibration circuit 21 to a voltage source 34. The voltage source 34 may be coupled to the spindle 18 other than through the brushes 28. The switch 30 may be controlled by a signal from a control circuit 19 for the water source pipe 22, such that the switch 30 may couple the brushes 28 to the voltage source 34 (and thereby bias the saw blade 20) whenever the water 24 is flowing over the wafer 10. That is, when the water 24 is not flowing over the wafer 10, the bias of the brushes 28 may be controlled by a calibration circuit 21. As calibration is typically not performed during a sawing operation, the operation of the switch 30 should not interfere with calibration, and vice versa. Likewise, as water 24 typically flows during a sawing operation, the switch 30 and the voltage source 34 may operate to bias the saw blade 20 whenever a sawing operation is being performed.

Biasing the saw blade 20 may reverse and/or null the current path 23, thereby potentially reducing the build-up of positive charges in the substrate 11. In some embodiments, the voltage source 34 may have a voltage of from −20 to −60V. The polarity of the voltage source may depend on the type of blade used and the material of the substrate. In particular embodiments, the voltage source 34 may have a voltage level of −48V.

Other methods of biasing the wafer 10, biasing the saw blade 20, and/or grounding the wafer 10 in order to reduce the build-up of positive charges in the substrate 11 are disclosed in U.S. Provisional Patent Application Ser. No 60/711,752 entitled "METHODS AND SYSTEMS FOR REDUCING CONTAMINATION OF SEMICONDUCTOR DEVICES AND MATERIALS DURING SAWING" filed Aug. 26, 2005, the disclosure of which is incorporated herein by reference as if fully set forth herein.

Figure 4:
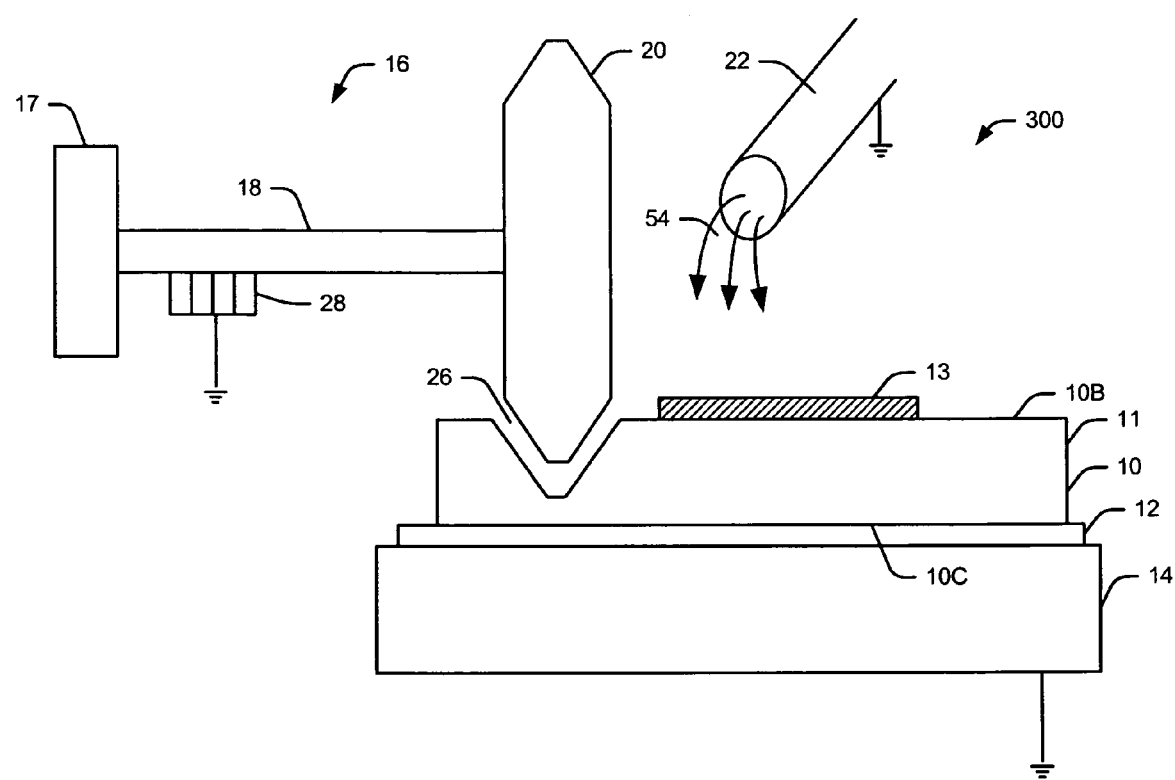
FIG. 4 is a diagram illustrating systems and methods for sawing a wafer according to embodiments of the invention.

Alternatively and/or in addition to blade biasing, some embodiments of the invention provide methods of processing semiconductor wafers in which an oxidizing agent is flowed over the semiconductor wafer during processing thereof, as illustrated in FIG. 4. System 300 shown in FIG. 4 is similar to the system 100 of FIG. 2. In particular, the system 300 of FIG. 4 includes a saw 16 including a rotating saw blade 20 mounted to a drive spindle 18 that is driven by a motor 20. The saw blade 20 forms a saw cut 26 in a wafer 10 mounted on an adhesive tape 12. In the embodiments of FIG. 4, an oxidizing agent is included in the water flow 54.

The oxidizing agent may react with the ionizing agent to reduce and/or mitigate the effects of the ionizing agent. For example, atomic phosphorus may be oxidized to form phosphate, which may be less reactive with the metal layer 13. The oxidizing agent may further reduce or prevent organic materials from bonding to the surface of the metal layer 13 due to the formation of hydroxide ions (OH$^-$) at the metal surface. A surfactant effect of the oxidizing agent may further help to reduce bonding of organic materials to the metal layer 13.

The oxidizing agent may include a peroxide, such as hydrogen peroxide, which may be included in the water flow 54 at a concentration of between about 20 and about 250 parts per million (ppm) by volume. Other suitable oxidizing agents may include peroxides such as sodium peroxide, calcium peroxide, magnesium peroxide, and/or urea hydrogen peroxide. It will be appreciated that while some peroxides such as calcium peroxide and magnesium peroxide are not soluble in water, they may shed peroxide ions when exposed to water, which may contribute to the concentration of O⁻ ions in the water flow 54.

Still further suitable oxidizing agents may include materials such as potassium monopersulfate, ammonium permanganate, chlorates, and/or iodates such as ammonium iodate. Such oxidizing agents may be provided at a concentration of about 20 to about 400 ppm by volume in order to provide an equivalent contribution of O⁻ to the water as would be provided by hydrogen peroxide at a concentration of about 20 and about 250 ppm by volume. That is, the oxidizing agents may be provided at a concentration that produces a concentration of O⁻ in the water flow 54 of between about 20 and about 250 ppm by volume.

In some embodiments, the oxidizing agent may include ozonated water at a concentration of about 1 to 2 ppm by volume.

In some embodiments, the mixture may further include an accelerator/booster, such as a diamine, which may act as a catalyst in the oxidation reaction. For example, an additive such as tetraacetylethylenediamine (TAED) may be included in the water flow 54 as a catalyst for the oxidation reaction at a concentration of up to 100% of the oxidizer concentration. However, in some embodiments, TAED may be included at a concentration of about 5 to 10% of the oxidizer concentration.

Embodiments of the invention may be used in other semiconductor processing operations in which purified water is flowed over a semiconductor substrate/device. For example, after a sawing operation, it may be desirable to "scrub" the dice by directing a flow of pressurized water at the devices. According to some embodiments of the invention, an oxidizing agent such as a peroxide may be included in the high pressure water flow.

An additional potential benefit of some embodiments of the invention is that wafer saws may require less cleaning, since embodiments of the invention may reduce the build-up of organic and/or other materials on the saw equipment itself. Accordingly, semiconductor processing equipment may be kept in service for longer periods of time, which may improve product throughput, product yields, and/or equipment utilization.

After the mixture of water and hydrogen peroxide have been flowed across a semiconductor substrate/device, the mixture may be exposed to light having a wavelength of between about 254 nm and about 360 nm to break the hydrogen peroxide down into water and oxygen. Accordingly, embodiments of the invention may produce byproducts that do not need special waste handling.

Figure 5A:
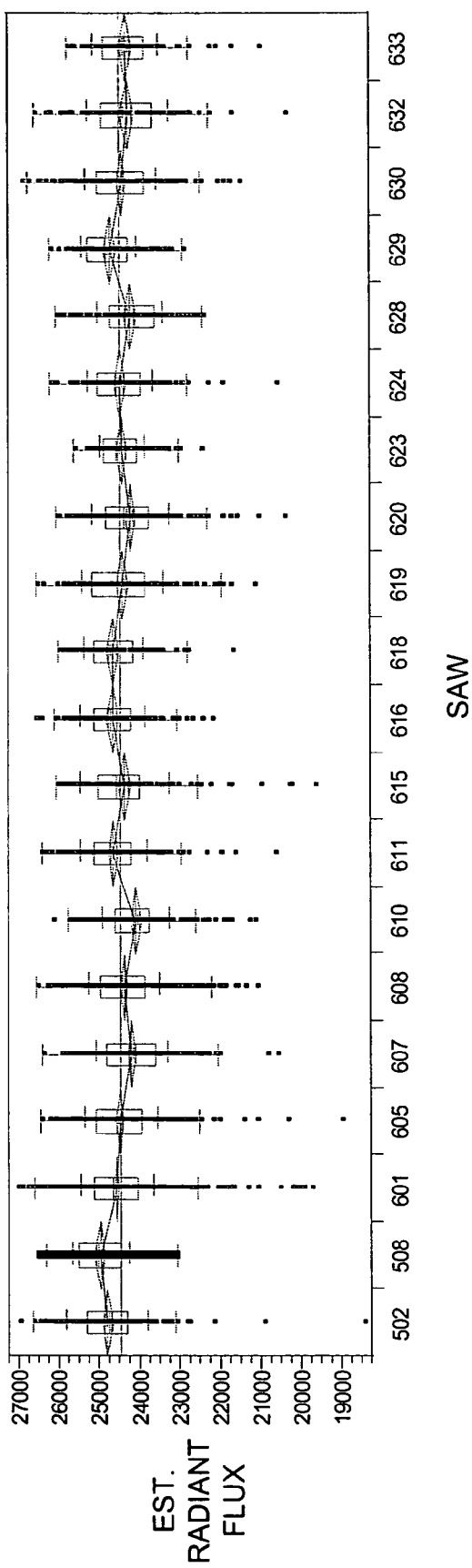
FIGS. 5A-5C are plots of radiant flux emitted by light emitting devices manufactured from wafers processed according to embodiments of the invention for various types of devices.
Figure 5B:
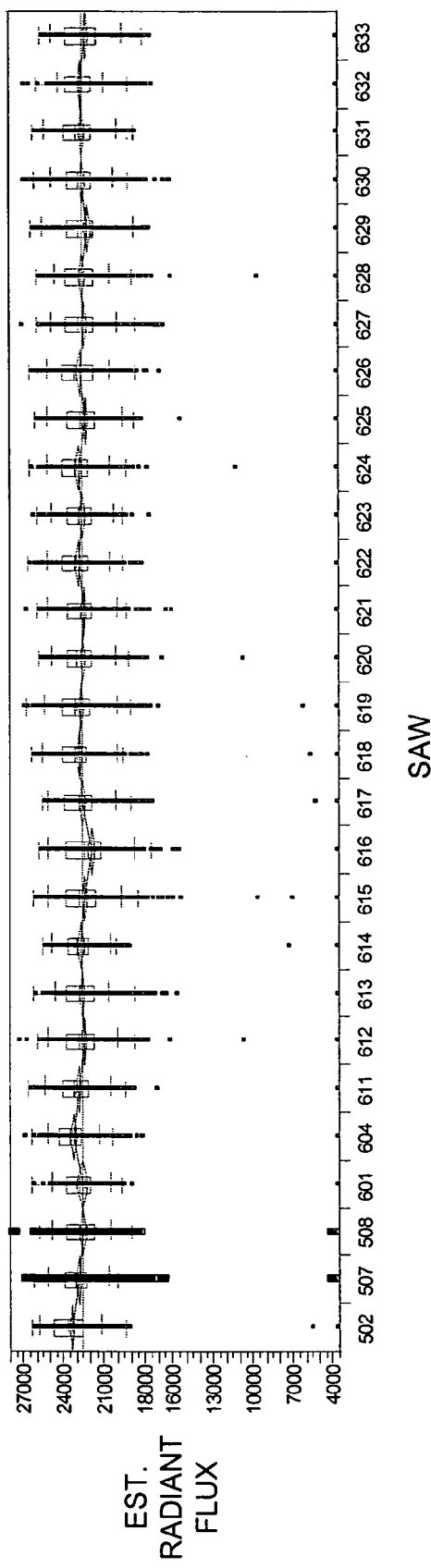
Figure 5C:
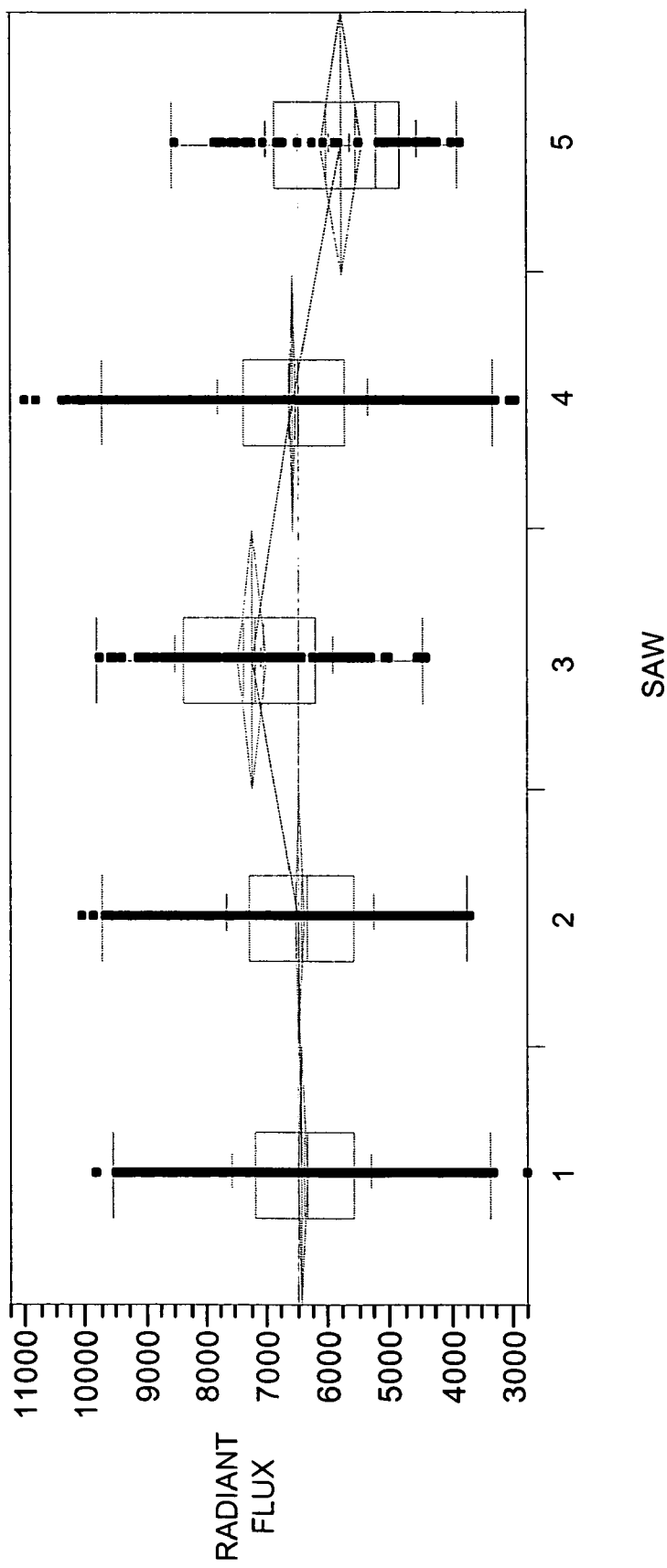

FIGS. 5A-5C are plots of radiant flux emitted by light emitting devices manufactured from wafers processed according to embodiments of the invention for various types of devices. For example, FIG. 5A contains statistical plots of estimated radiant flux (Rf) in microwatts for a plurality of light emitting devices of a first type that were singulated using a plurality of circular dicing saws. For one of the saws, (saw 508), a mixture of RO purified water and hydrogen peroxide (100 ppm by volume) was flowed over the surface of the substrates during the sawing operation. For all other saws shown on FIG. 5A, the saw blade was biased at −48V during the sawing operation.

As shown by FIG. 5A, the results obtained by adding hydrogen peroxide to the water flow were similar to the results obtained by biasing the saw blade. However, adding hydrogen peroxide tended to provide more consistent results, with fewer outlying data points.

FIG. 5B is similar to FIG. 5A, except that the data were taken for light emitting devices of a second type. As with FIG. 5A, for one of the saws, (saw 508), a mixture of RO purified water and hydrogen peroxide (100 ppm by volume) was flowed over the surface of the substrates during the sawing operation. For all other saws shown on FIG. 5A, the saw blade was biased at −48V during the sawing operation. Once again, the results obtained by adding hydrogen peroxide to the water flow were similar to the results obtained by biasing the saw blade, except that there were some outlying data points for the saw 508.

FIG. 5C is a plot of radiant flux for yet a different type of device for different types/configurations of saws. The different types/configurations of saws are shown in Table 1, below.

TABLE 1

| | Saw Types | | |
|---|---|---|---|
| Saw | Type | Biased | Peroxide |
| 1 | Type 1 | Yes | No |
| 2 | Type 1 | No | No |
| 3 | Type 2 | Yes | No |
| 4 | Type 2 | No | No |
| 5 | Type 2 | No | Yes |

As indicated in Table 1, the blades of saws 1 and 2 were biased, while the blades of the other saws were unbiased. Hydrogen peroxide was added to the water flow of saw 5 at 100 ppm by volume. While the average radiant flux measured from the devices processed by saw 5 was slightly lower than the other saws, the 95% confidence interval was lower, possibly indicating more consistent device behavior.

Figure 6A:
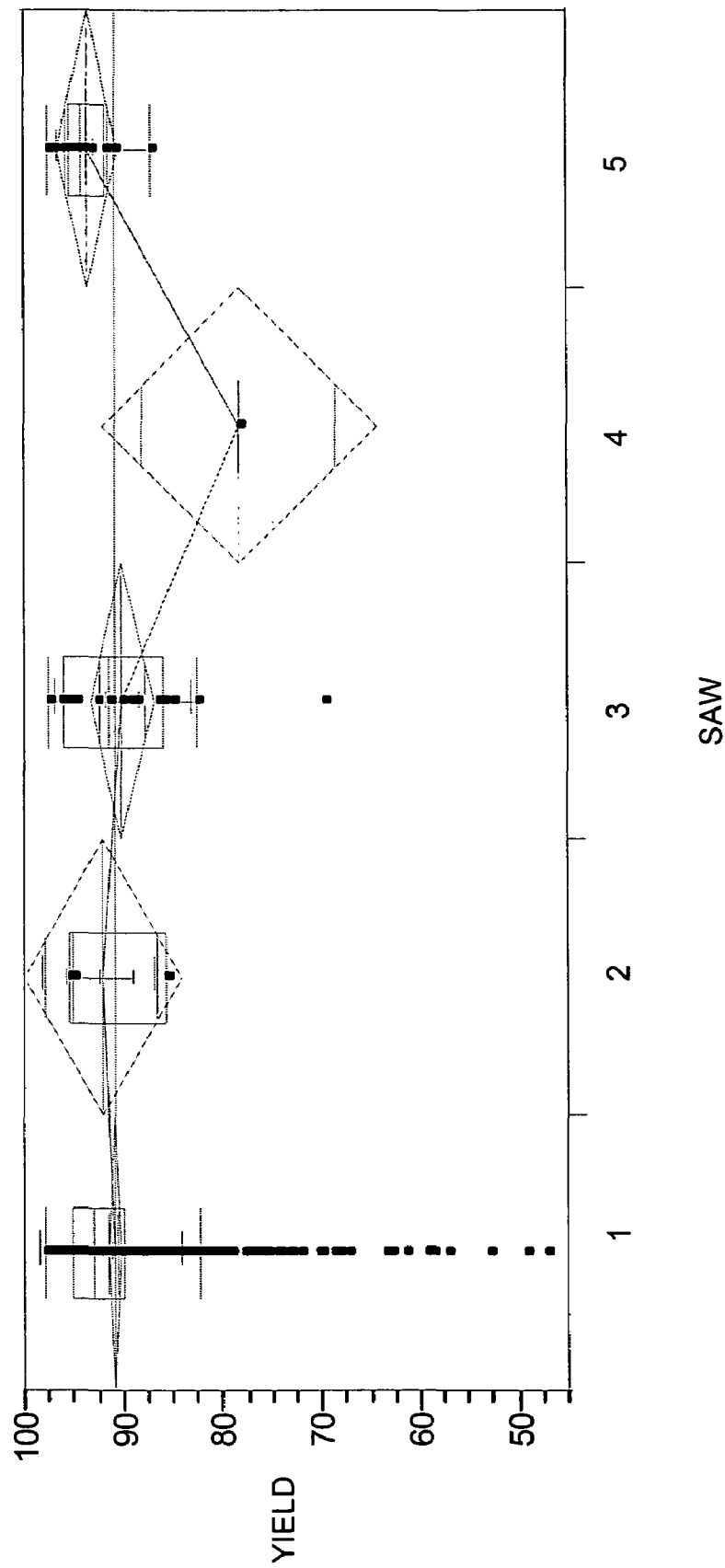
FIGS. 6A-6C are plots of yield results for wafers processed according to embodiments of the invention for various types of devices.
Figure 6B:
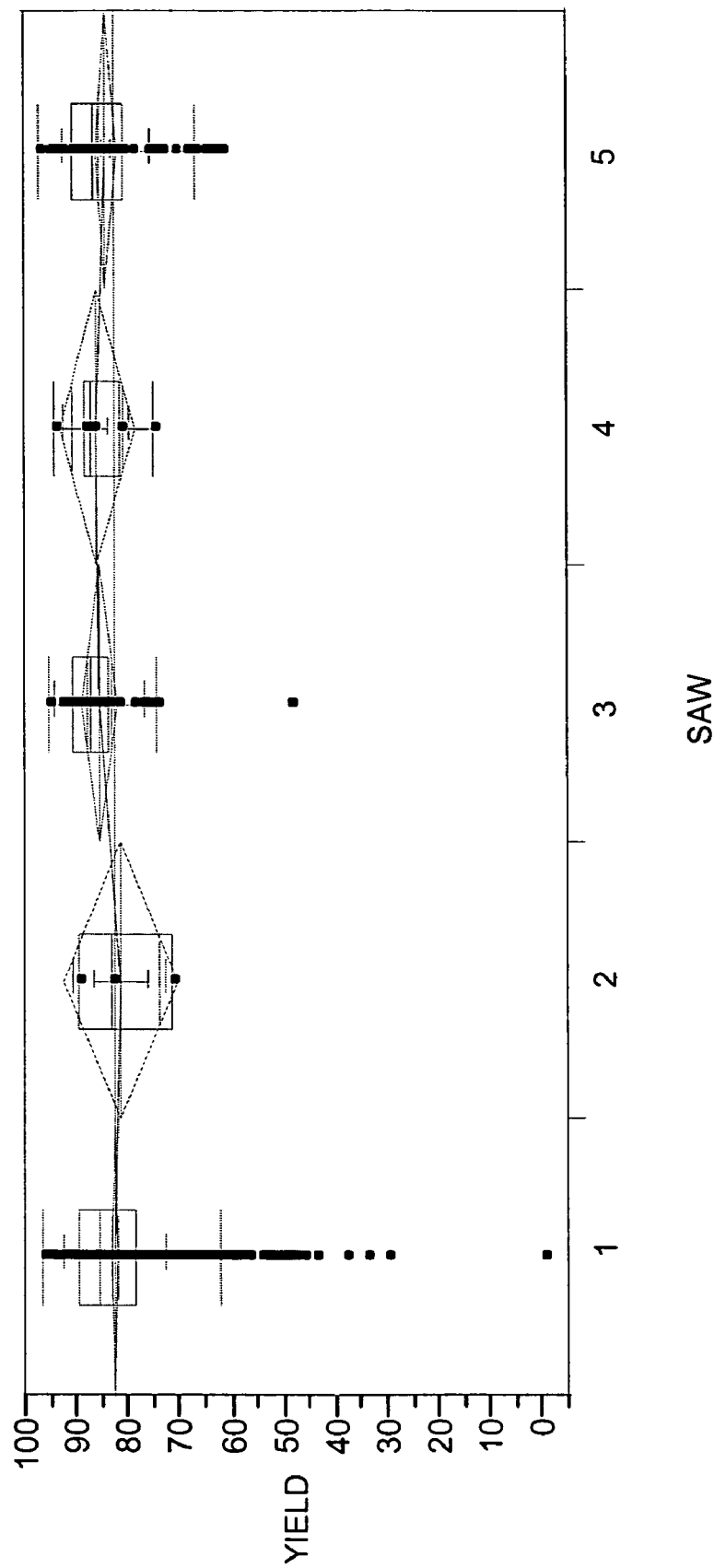
Figure 6C:
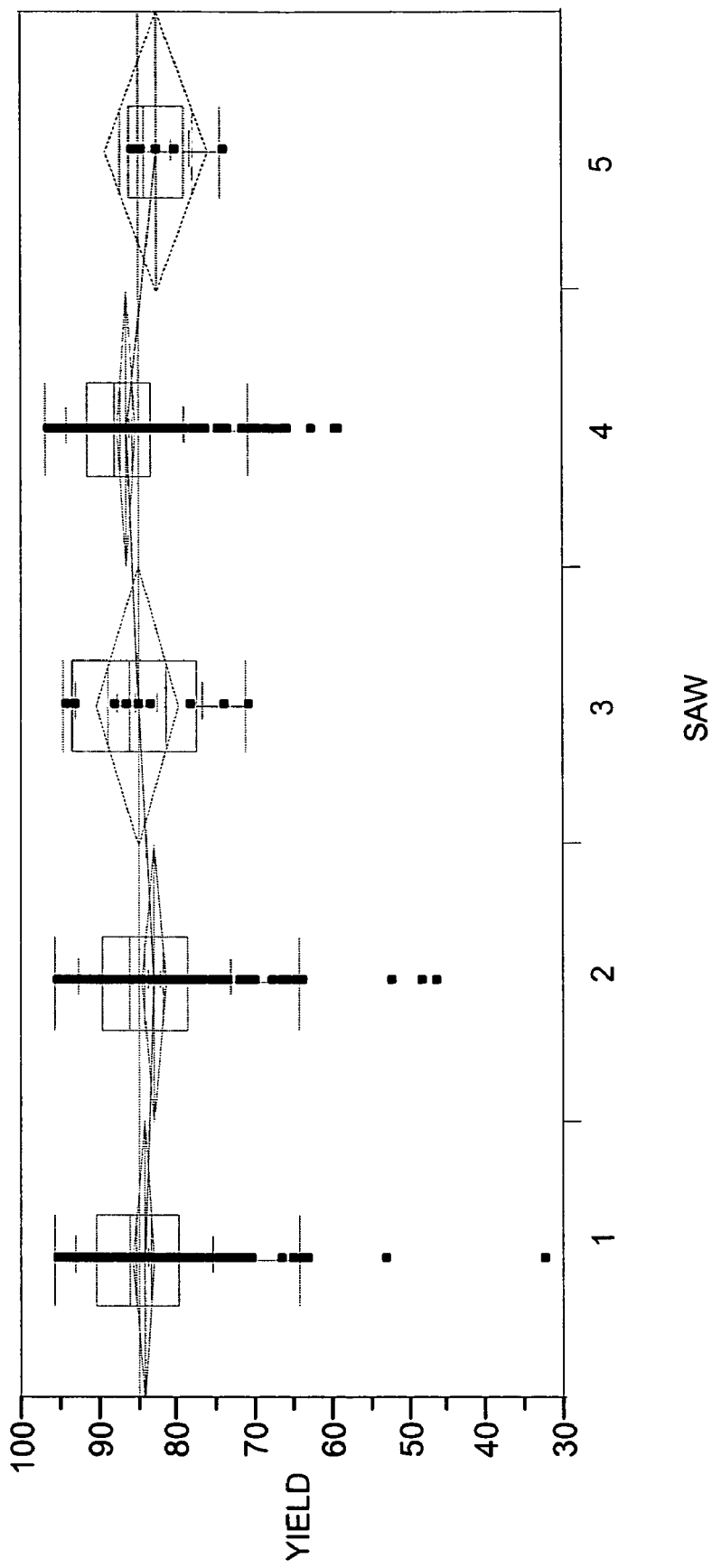

FIGS. 6A-6C are plots of visual inspection yield results for wafers processed according to embodiments of the invention for various types of devices for the saws shown in Table 1. FIGS. 6A-6C indicate that the yields for devices processed using saw 5 were about as good for all three device types, and in some cases higher.

While embodiments of the present invention have been described with reference to sawing partially through a wafer, embodiments of the present invention may also be suitable for use in providing saw cuts that extend completely through a wafer. For example, while partial saw cuts may be used to provide substrate shaping and/or to score a substrate for subsequent singulation (for example, through breaking the substrate along score lines), complete saw cuts may be used to perform singulation of the dice. Thus, the present invention should not be construed as limited to sawing partially through a substrate of a wafer.

Furthermore, while embodiments of the invention have been illustrated in which an n-type substrate 11 is employed, the invention is applicable to sawing p-type substrates as well.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of operating a dicing saw including a rotary saw blade and configured to saw a semiconductor substrate, the method comprising:

flowing a mixture of water and an oxidizing agent over the semiconductor substrate, wherein the mixture further comprises a catalyst or oxidation enhancing agent; and sawing the semiconductor substrate with the dicing saw; wherein sawing the semiconductor substrate is performed while flowing the mixture over the semiconductor substrate.

2. The method of claim 1, wherein flowing the mixture over the semiconductor substrate comprises flowing the mixture over the semiconductor substrate at a location where the saw blade contacts the semiconductor substrate.

3. The method of claim 1, wherein the dicing saw is configured to saw through the semiconductor substrate.

4. The method of claim 1, wherein the dicing saw is configured to saw into, but not through, the semiconductor substrate.

5. The method of claim 1, wherein the substrate comprises a conductive material.

6. The method of claim 5, wherein the substrate comprises silicon carbide, silicon, gallium arsenide, germanium, aluminum and/or copper.

7. The method of claim 1, wherein the substrate includes a metal layer thereon.

8. The method of claim 7 wherein the metal layer comprises a metal that is susceptible to ionization by an ionizing agent.

9. The method of claim 8, wherein the metal layer comprises gold, palladium and/or platinum.

10. The method of claim 1, wherein the oxidizing agent comprises hydrogen peroxide and the mixture comprises about 20 to about 250 ppm by volume of hydrogen peroxide.

11. The method of claim 10, wherein the mixture comprises about 100ppm by volume of hydrogen peroxide.

12. The method of claim 1, wherein the oxidizing agent comprises sodium peroxide, calcium peroxide, magnesium peroxide, and/or urea hydrogen peroxide.

13. The method of claim 1, wherein the oxidizing agent comprises potassium monopersulfate, ammonium permanganate, a chlorate, ammomum iodate and/or other iodates having a concentration of about 20 to about 400 ppm by volume.

14. The method of claim 1, wherein the oxidizing agent is included in the aqueous mixture at a concentration that produces a concentration of $O^-$ ions of between about 20 and about 250 ppm by volume.

15. The method of claim 1, wherein the oxidizing agent comprises ozonated water having a concentration of at least about 1 ppm by volume.

16. The method of claim 1, wherein the catalyst comprises tetraacetylethylenediamine.

17. The method of claim 1, further comprising:
exposing the mixture to light having a wavelength of between about 254 nm and about 360 nm.

18. The method of claim 17 wherein exposing the mixture to light is performed after the mixture has been flowed over the substrate.

19. A method of processing a semiconductor structure including a metal layer in the presence of organic material, the method comprising:
flowing an aqueous mixture comprising an oxidizing agent over the semiconductor structure during processing of the semiconductor structure, wherein the mixture further comprises a catalyst or oxidation enhancing agent, wherein processing the semiconductor structure comprises sawing the semiconductor structure while flowing the mixture over the semiconductor substrate.

20. The method of claim 19, wherein processing the semiconductor structure comprises scrubbing the semiconductor structure with pressurized water.

21. The method of claim 19, wherein the oxidizing agent comprises peroxide.

22. The method of claim 21, wherein the oxidizing agent comprises hydrogen peroxide.

23. The method of claim 21, wherein the oxidizing agent comprises sodium peroxide, calcium peroxide, magnesium peroxide, and/or urea hydrogen peroxide.

24. The method of claim 19 wherein the oxidizing agent comprises potassium monopersulfate, ammonium permanganate, a chlorate, ammonium iodate and/or other iodates having a concentration of 20 to 400 ppm by volume.

25. The method of claim 19, wherein the oxidizing agent is included in the aqueous mixture at a concentration that produces a concentration of $O^-$ ions of between about 20 and about 250 ppm by volume.

26. The method of claim 19, wherein the oxidizing agent comprises ozonated water having a concentration of at least 2 ppm by volume.

27. A method of forming a semiconductor device, comprising:
forming a semiconductor device precursor structure on a substrate; and
separating the semiconductor device precursor from the substrate while flowing a mixture of water and an oxidizing agent over the substrate, wherein the mixture further comprises a catalyst or oxidation enhancing agent.

28. The method of claim 27, wherein separating the semiconductor device precursor comprises sawing the substrate.

29. The method of claim 27, further comprising:
mounting the substrate on a mounting film.

30. The method of claim 29, wherein the mounting film comprises a flexible adhesive tape.

31. The method of claim 27, wherein the semiconductor device precursor comprises a light emitting device precursor.

32. The method of claim 27, wherein the substrate comprises silicon carbide, silicon, gallium arsenide, germanium, aluminum and/or copper.

33. The method of claim 27, wherein the semiconductor device precursor comprises a metal layer.

34. The method of claim 33, wherein the metal layer comprises gold, platinum and/or palladium.

35. The method of claim 27, wherein the oxidizing agent comprises hydrogen peroxide and the mixture comprises about 20 to about 250 ppm by volume of hydrogen peroxide.

36. The method of claim 35, wherein the mixture comprises about 100ppm by volume of hydrogen peroxide.

37. The method of claim 27, wherein the oxidizing agent comprises a peroxide.

38. The method of claim 37, wherein the oxidizing agent comprises sodium peroxide, calcium peroxide, magnesium peroxide, and/or urea hydrogen peroxide.

39. The method of claim 27, wherein the oxidizing agent comprises potassium monopersulfate, ammonium permanganate, a chlorate, ammonium iodate and/or other iodates having a concentration of about 20 to about 400 ppm by volume.

40. The method of claim 27, wherein the oxidizing agent is included in the aqueous mixture at a concentration that produces a concentration of $O^-$ ions of between about 20 and about 250 ppm by volume.

41. The method of claim 27, wherein the oxidizing agent comprises ozonated water having a concentration of at least about 2 ppm by volume.

* * * * *

UNITED STATES PATENT AND TRADEMARK OFFICE
CERTIFICATE OF CORRECTION

PATENT NO. : 7,531,431 B2  Page 1 of 1
APPLICATION NO. : 11/437934
DATED : May 12, 2009
INVENTOR(S) : Rayfield et al.

It is certified that error appears in the above-identified patent and that said Letters Patent is hereby corrected as shown below:

In the Claims:

Column 11, Claim 13, Line 32:
Please correct "ammomum" to read -- ammonium --

Signed and Sealed this

Fourteenth Day of July, 2009

JOHN DOLL
*Acting Director of the United States Patent and Trademark Office*